US010530257B1

(12) United States Patent
Egan et al.

(10) Patent No.: US 10,530,257 B1
(45) Date of Patent: Jan. 7, 2020

(54) ADDING A VOLTAGE LEVEL TO A PHASE-REDUNDANT REGULATOR LEVEL

(71) Applicant: International Business Machines Corporation, Armonk, NY (US)

(72) Inventors: Patrick Egan, Rochester, MN (US); Michael Lee Miller, Rochester, MN (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 16/364,729

(22) Filed: Mar. 26, 2019

(51) Int. Cl.
*H02M 1/32* (2007.01)
*H02M 3/158* (2006.01)
*H02M 1/00* (2006.01)
*H03K 19/20* (2006.01)

(52) U.S. Cl.
CPC .......... *H02M 3/1584* (2013.01); *H02M 1/32* (2013.01); *H02M 2001/0009* (2013.01); *H02M 2001/0045* (2013.01); *H03K 19/20* (2013.01)

(58) Field of Classification Search
CPC .......... H02M 1/32; H02M 1/36; H02M 3/158; H02M 3/1584; H02M 2001/0009; H02M 2001/0045; H03K 19/20; H03K 19/23
See application file for complete search history.

(56) References Cited

U.S. PATENT DOCUMENTS

| 5,491,786 | A | 2/1996 | Egan et al. |
|---|---|---|---|
| 6,515,460 | B1 | 2/2003 | Farrenkopf |
| 6,650,556 | B2 | 11/2003 | Dinh et al. |
| 6,836,100 | B2 | 12/2004 | Egan et al. |
| 7,443,055 | B2 | 10/2008 | Pracht et al. |

(Continued)

FOREIGN PATENT DOCUMENTS

| CA | 2424852 A1 | 10/2003 |
|---|---|---|
| EP | 3120435 B1 | 5/2018 |
| WO | 94/23489 A1 | 10/1994 |

OTHER PUBLICATIONS

Konstantinou et al., "Utilising Redundant Voltage Levels for Circulating Current Control in Modular Multilevel Converters," IECON 2015—41st Annual Conference of the IEEE Industrial Electronics Society, 2015, 6 pages. DOI: 10.1109/IECON.2015.7392430.

(Continued)

*Primary Examiner* — Matthew V Nguyen
(74) *Attorney, Agent, or Firm* — Nathan M. Rau (57) ABSTRACT

A phase-redundant voltage regulator can include multiple regulator phases connected in parallel between a common regulator input and a common regulator output. Each regulator phase includes a voltage regulator that receives an input voltage and drives a respective output voltage. The voltage regulator also includes a plurality of linear regulators, each having a linear ORing device electrically connected between the regulator output of a respective regulator and an output of the linear regulator. The voltage regulator also includes an amplifier having inputs electrically connected to a remote voltage sense input and to a reference voltage input. An output of the voltage regulator is electrically connected to an input of the linear ORing device. The amplifier controls the linear ORing device to drive a voltage on the output of the linear regulator equivalent to a voltage on the reference voltage input.

20 Claims, 4 Drawing Sheets

(56) References Cited

U.S. PATENT DOCUMENTS

| | | | |
|---|---|---|---|
| 8,233,299 B2 | 7/2012 | Ahmad et al. | |
| 8,441,241 B2* | 5/2013 | Krishnamurthy | H02M 3/1584 323/272 |
| 8,610,308 B2 | 12/2013 | Shires et al. | |
| 8,901,909 B2 | 12/2014 | Khanna et al. | |
| 9,189,040 B2 | 11/2015 | Phadke et al. | |
| 9,213,385 B2 | 12/2015 | Berke et al. | |
| 9,490,663 B1 | 11/2016 | Kim et al. | |
| 9,679,885 B2 | 6/2017 | Lidsky et al. | |
| 9,712,080 B2 | 7/2017 | Phadke | |
| 10,097,092 B1* | 10/2018 | Ho | H02M 3/1584 |
| 2005/0141158 A1 | 6/2005 | Sae-Ueng et al. | |
| 2008/0164759 A1 | 7/2008 | Sharma et al. | |
| 2013/0328400 A1* | 12/2013 | Barus | G06F 1/28 307/43 |
| 2014/0225586 A1* | 8/2014 | Covi | H02M 3/1584 323/299 |

OTHER PUBLICATIONS

Jung, E., "A FET OR-ing Circuit for Fault-Tolerant Power Systems," Application Report, SLVA116—May 2002, pp. 1-10, Texas Instruments.

Miller et al., "Sharing Redundant Regulator Phases Within a Phase-Redundant Voltage Regulator Apparatus," U.S. Appl. No. 16/364,748, filed Mar. 26, 2019.

Miller et al., "Sharing Redundant Regulator Phases Within a Phase-Redundant Voltage Regulator Apparatus," U.S. Appl. No. 16/364,782, filed Mar. 26, 2019.

Miller et al., Reallocation of Regulator Phases Within a Phase-Redundant Voltage Regulator Apparatus, U.S. Appl. No. 16/364,967, filed Mar. 26, 2019.

Miller et al., Reallocation of Regulator Phases Within a Phase-Redundant Voltage Regulator Apparatus, U.S. Appl. No. 16/365,002, filed Mar. 26, 2019.

* cited by examiner

ADDING A VOLTAGE LEVEL TO A PHASE-REDUNDANT REGULATOR LEVEL

BACKGROUND

The present disclosure generally relates to voltage regulator circuits. In particular, this disclosure relates to adding a low-current voltage level to an existing voltage level of a voltage regulator circuit.

A voltage regulator is an electronic device or system designed to receive an input voltage and automatically maintain a constant voltage level on one or more output terminals. Depending on the design, a voltage regulator can be used to regulate one or more alternating current (AC) or direct current (DC) voltages. Voltage regulators can be included in electronic devices such as computer power supplies where they can be used to stabilize DC voltages used to supply power to electronic components such as processor(s), memory devices, and other types of integrated circuits (ICs). A voltage regulator circuit can receive a feedback voltage received from a sense point located adjacent to electronic component(s) that the voltage regulator supplies power to. This feedback voltage can be used to modulate an output voltage of the voltage regulator. This modulated output voltage can result in the voltage received by the supplied electronic component(s) being maintained at a stable value regardless of the current draw of the components or voltage drop across conductors interconnecting the voltage regulator to the components.

A field-effect transistor (FET) is a transistor that uses an electric field to control the shape and hence the conductivity of a channel of one type of charge carrier in a semiconductor material. FETs can be unipolar transistors as they can involve single-carrier-type operation. FETs can be majority-charge-carrier devices, in which the current flow is carried predominantly by majority carriers, or minority-charge-carrier devices, in which the current is mainly due to a flow of minority carriers. A FET device can consist of an active channel through which charge carriers, electrons or holes, flow from a source to a drain. Source and drain terminal conductors can be connected to the semiconductor through ohmic contacts. The conductivity of the channel can be a function of the electric potential applied across the gate and source terminals.

SUMMARY

Embodiments can be directed towards a phase-redundant voltage regulator apparatus. The apparatus can include a plurality of regulator phases connected in parallel between a common regulator input and a common regulator output. At least one regulator phase of the plurality of regulator phases can enable redundancy. Each regulator phase of the plurality of regulator phases can include a regulator configured to receive, at a regulator input, an input voltage and provide, at a regulator output, a respective output voltage. The phase-redundant voltage regulator apparatus can also include a plurality of linear regulators. Each linear regulator of the plurality of linear regulators can have a linear ORing device electrically connected between the regulator output of a respective regulator and an output of the linear regulator. Each linear regulator of the plurality of linear regulators can also have an amplifier having inputs electrically connected to a remote voltage sense input and to a reference voltage input. The amplifier can also have an output electrically connected to an input of the linear ORing device. The amplifier can be configured to control the linear ORing device to drive a voltage on the output of the linear regulator equivalent to a voltage on the reference voltage input.

Embodiments can also be directed towards a phase-redundant voltage regulator apparatus. The phase-redundant voltage regulator apparatus can include a plurality of regulator phases connected in parallel between a common regulator input and a common regulator output. At least one regulator phase of the plurality of regulator phases can enable redundancy. Each regulator phase of the plurality of regulator phases can include a regulator configured to receive, at a regulator input, an input voltage and provide, at a regulator output, a respective output voltage. The a phase-redundant voltage regulator apparatus can also include a plurality of linear regulators. Each linear regulator of the plurality of linear regulators can include a linear ORing field-effect transistor (FET) electrically connected between the regulator output of a respective regulator phase and an output of the linear regulator. Each linear regulator of the plurality of linear regulators can also include an operational amplifier (op-amp) having a negative input electrically coupled to a remote voltage sense input and a positive input electrically coupled to a reference voltage input. The op-amp can also having an output electrically connected to a gate terminal of the linear ORing FET, and can be configured to control the linear ORing FET to drive a voltage on the output of the linear regulator equivalent to a voltage on the reference voltage input.

Embodiments can also be directed towards a method for generating, with a phase-redundant voltage regulator apparatus that includes a plurality of linear regulators, a secondary output voltage. The phase-redundant voltage regulator apparatus can include a plurality of regulator phases connected in parallel between a common regulator input and a common regulator output. At least one regulator phase of the plurality of regulator phases can enable redundancy. Each regulator phase of the plurality of regulator phases can include a regulator configured to receive, at a regulator input, an input voltage and provide, at a regulator output, a respective output voltage. The phase-redundant voltage regulator apparatus can also include a plurality of linear regulators. Each linear regulator of the plurality of linear regulators can have a linear ORing device electrically connected between the regulator output of a respective regulator and an output of the linear regulator. Each linear regulator of the plurality of linear regulators can also have an amplifier having inputs electrically connected to a remote voltage sense input and to a reference voltage input. The amplifier can further have an output electrically connected to an input of the linear ORing device. The amplifier can be configured to control the linear ORing device to drive a voltage on the output of the linear regulator equivalent to a voltage on the reference voltage input. The method can include receiving, with the amplifier, a sense voltage at the remote voltage sense input and a reference voltage at the reference voltage input. The method can also include generating, at the output of the amplifier, a control voltage corresponding to a difference between a sense voltage and the reference voltage. The method can also include driving, with the linear ORing device, in response to the control voltage received at the input of the linear ORing device, a voltage on the output of the linear regulator that is equivalent to the reference voltage.

The above summary is not intended to describe each illustrated embodiment or every implementation of the present disclosure.

BRIEF DESCRIPTION OF THE DRAWINGS

The drawings included in the present application are incorporated into, and form part of the specification. They illustrate embodiments of the present disclosure and, along with the description, serve to explain the principles of the disclosure. The drawings are only illustrative of certain embodiments and do not limit the disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

In the drawings and the Detailed Description, like numbers generally refer to like components, parts, steps, and processes.

DETAILED DESCRIPTION

Certain embodiments of the present disclosure can be appreciated in the context of adding one or more low-current voltage levels to an existing voltage level of a voltage regulator circuit. Adding such low-current voltage levels can be useful in providing, at relatively low-cost and design complexity, a variety of supply voltages by using voltage regulator circuits that are physically smaller and less complex than other types of voltage regulator circuits.

Embodiments can provide low-current voltage levels to electronic equipment such as servers, which may be used to provide data to clients attached to a server through a network. Such servers may include, but are not limited to web servers, application servers, mail servers, and virtual servers. While not necessarily limited thereto, embodiments discussed in this context can facilitate an understanding of various aspects of the disclosure. Certain embodiments may also be directed towards other equipment and associated applications, such as providing low-current voltage levels to electronic equipment such as computing systems, which may be used in a wide variety of computational and data processing applications. Such computing systems may include, but are not limited to, supercomputers, high-performance computing (HPC) systems, and other types of special-purpose computers. Embodiments may also be directed towards low-current voltage levels for equipment used in such as telecommunications, airborne, and automotive applications.

The acronym "FEY" is used herein in reference to a field-effect transistor which can be useful, within a voltage regulator design, to interconnect two circuit nodes by providing a relatively low impedance electrical connection between the nodes. It can be understood that in embodiments, various types of FETs can be selected by a voltage regulator designer to meet electrical performance criteria of certain voltage regulator designs. Such FET types can include, but are not limited to enhancement-mode, depletion-mode, N-channel field-effect transistor (NFET) and P-channel field-effect transistor (PFET) devices. Such FETs may also be referred to "power FETs," and "power metal-oxide-semiconductor field-effect transistors" (MOSFETs), without loss of meaning. It can also be understood that, in some embodiments, various other types of electronic devices can be used in place of FETs. Such electronic devices can include, but are not limited to, bipolar devices such as NPN and PNP transistors as well as transistors fabricated in other semiconductor technologies.

For ease of discussion and illustration, the terms "ORing device" and "ORing FET" may be used interchangeably, without loss of meaning, to refer to a semiconductor device configured to prevent the flow of current into a voltage regulator phase output. Although a FET symbol, e.g., 252, FIG. 2, has been used to represent such a device in the Figures, this is not to be construed as limiting; other types of devices, as described above, may also be used for a similar purpose.

The descriptor "ORing," used herein in reference, for example, to "ORing devices," "ORing FETs" and "ORing regulators," can be understood as referring to the logical OR function and output protection function of a device, e.g., FET, or voltage regulator. Such devices and voltage regulators are protected from reverse current flow into a device output by a FET configured to perform in a similar manner as an output protection diode.

The terms "phase" and "regulator phase" are used interchangeably herein in reference to a redundant voltage regulator used within a voltage regulator apparatus. The voltage regulator phase is generally activated by a multi-phase controller (MPC) at a time that is different than activation times of other voltage regulators. This is commonly referred to as being activated "out of phase" with the other voltage regulators.

A wide range of electronic systems employ voltage regulators to provide power delivery, at a stable voltage, to electronic components within the systems. Such electronic systems can include, but are not limited to, computers, computing equipment, servers and equipment used in telecommunications, airborne, and automotive applications. Components within the systems can include, but are not limited to, central processing units (CPUs), graphics processing units (GPUs), other integrated circuit (IC) types, hard disk drives, solid-state drives (SSDs), memory and other types of electronic components and devices.

A voltage regulator can be electrically connected between a power supply and components specified to receive a voltage that is lower than a voltage provided by the power supply. For example, a power supply may provide a variety of voltages, for example 12 V, 24 V or 48 V DC, to a voltage regulator. Output voltages of the voltage regulator can include, for example, 3.3 V, 2.5 V, 1.8 V, 1.0 V, 0.7 V or any other voltage(s) specified as suitable for the powered electronic components and systems.

Voltage regulators including parallel-connected phase-redundant regulators can provide numerous benefits to various electronic systems that they supply power to. For example, such voltage regulators can provide increased system reliability and robustness resulting from the ability of a voltage regulator apparatus to dynamically and automatically replace a failed or faulted regulator phase with a redundant spare or "backup" phase. A regulator phase can fail due to the failure, e.g., short-circuiting, of one or more components such as capacitors, FETs, amplifiers or driver circuits within the regulator phase.

Electronic system reliability can also be increased as a result of reduction of the number of decoupling capacitors within a phase-redundant voltage regulator design. This reduction in capacitor count can result in a lowering of the effective failure rate of the voltage regulator. The addition of one or more redundant or spare phases to a voltage regulator design can also increase the reliability of the design by lowering the overall current demands placed on each of the multiple redundant phases included within the voltage regulator.

The use of phase-redundant regulators having phases activated at staggered times can also result in decreased output voltage ripple and enhanced transient response to variations in current load placed on the phases. Multiple redundant regulator phases can be particularly useful in managing overall voltage regulator system cost. According to embodiments, the cost of a voltage regulator that uses multiple smaller, redundant regulator phases can be significantly less than the cost of a regulator that uses fewer, larger regulator phases each having greater current output.

Certain types of electronic systems can include various components and/or subsystems having specified supply voltage and current requirements that are lower than those specified for other types of components. For example, a computer system can have a number of CPUs each having a specified supply voltage requirement of 1.0 V at 80 A, which can be used to supply the majority of the logic circuits of the CPUs. However, the CPUs can each also have a second specified power supply voltage requirement of 0.85 V at 2A, for example, to supply a certain smaller section of logic or I/O circuits. Such circuits can be designed, for example, around a reduced supply voltage in order to conserve power, or to meet unique I/O voltage level specification.

In this example, each regulator phase of a phase-redundant regulator apparatus may be capable of delivering a relatively high current, for example, 40 A, to an attached load. A 40 A regulator could be employed to supply the specified 0.85 V at 2 A, and multiple such regulators could also be employed if voltage regulator phase-redundancy was required. However, a methodology of using high-current output regulators to supply a low-current voltage requirement may not be particularly efficient or cost-effective. Excessive and unnecessary cost, consumed power, system space/area, and design complexity can result from the use of this methodology. A more efficient voltage regulator design is desirable; one which reduces the number of components used, cost, consumed power, system area, and design complexity.

According to embodiments, a second phase-redundant regulator level can be added to a phase-redundant regulator level through the use of an additional ORing device, e.g., FET, electrically connected as a linear ORing regulator. Thus, for relatively low-current voltage levels, a higher current, higher voltage phase-redundant level can be used to supply an ORing device/FET that is used as linear regulator in order to create a lower voltage, at reduced current output levels. As a result, the cost, area, number of components and design complexity of a voltage regulator design can all be significantly reduced.

By way of example, this methodology can be used to create a 1.1 V regulator output level from a phase-redundant 1.2 V regulator, at an example reduced current level of 2 A. According to embodiments, the voltage difference between the higher voltage phase-redundant level and the lower voltage linear ORing regulator output is generally relatively small, e.g., less than 1 V, and the current draw from this linear output can be generally less than 5 A. These voltage and current examples are not to be construed as limiting, however, and are provided simply for purposes of illustration and clarification of embodiments of the present disclosure.

The figures herein depict certain example circuits, functions, electrical interconnections and component interactions used to implement embodiments of the present disclosure. These are provided by way of example, and are not to be construed as limiting. Embodiments can also include circuits, functions, electrical interconnections and component interactions not described or depicted herein, within the spirit and scope of the present disclosure.

For ease of illustration and discussion, a limited number of regulator phases, regulator phase groups and spare regulator phases are depicted and discussed herein. For example, a single regulator phase group including three regulator phases may be used to illustrate embodiments of the present disclosure. However, this is not to be construed as limiting; any other number of regulator phases, regulator phase groups and spare regulator phases may be used within embodiments. According to embodiments and design practices, the number "N" of regulator phases used to satisfy the current requirements of a voltage domain within an electronic system may be a relatively small number such as 1 or 2, or it may be much larger, such as 20 or more. Any number of regulator phase groups may be used within an electronic system to satisfy the needs for particular, unique voltage domains. A number of spare regulator phases may be selected by a power system designer based upon an expected average failure rate of a regulator phase, as well as other design criteria.

Embodiments of the present disclosure can be useful in reducing voltage regulator packaging size and cost, relative to a complete phase-redundant voltage level used to provide low-current voltage levels. An electronic system configured according to embodiments of the present disclosure may have increased reliability and reduced cost, complexity, parts count, and packing area for included voltage regulators.

A phase-redundant voltage regulator apparatus with linear regulators, designed according to certain embodiments, may be compatible with existing and proven electronic systems, and may be a useful and cost-effective way to add supplemental low-current voltage supplies to the electronic system. A phase-redundant voltage regulator apparatus constructed according to embodiments of the present disclosure may be installed within an existing electronic system.

Embodiments of the present disclosure can be useful for implementing phase-redundant voltage regulators with linear regulators for use within electronic systems by using existing and proven IC and printed circuit board (PCB) fabrication technologies and material sets, electronic design methodologies, design tools, and manufacturing processes.

Figure 1:
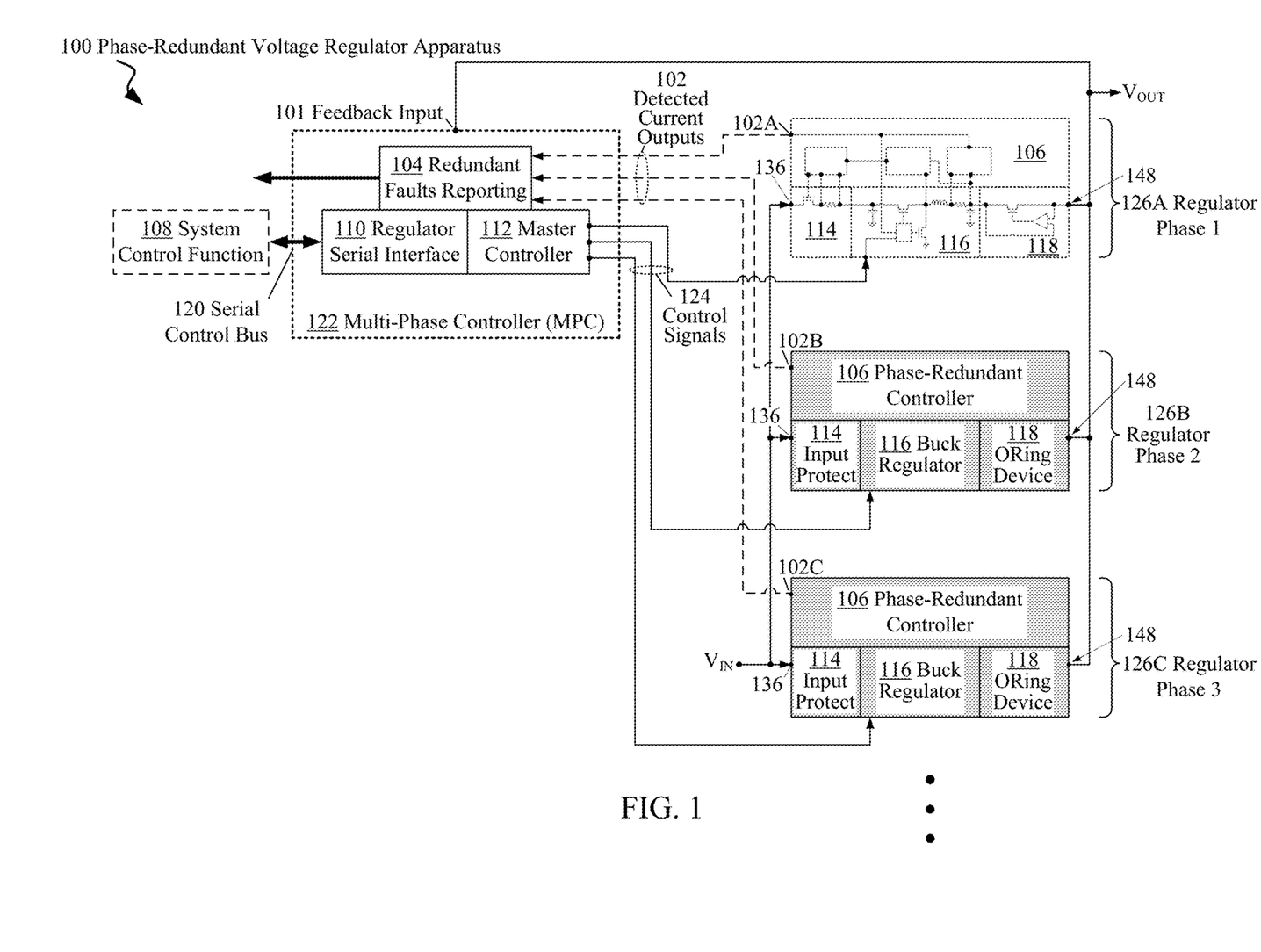
FIG. 1 is a block diagram depicting a phase-redundant voltage regulator apparatus, according to embodiments of the present disclosure.

FIG. 1 is a block diagram depicting a phase-redundant voltage regulator apparatus 100 that includes multiple redundant voltage regulators phases 126A, 126B and 126C. Multiple redundant regulator phases 126A, 126B and 126C are electrically connected in parallel between common regulator input $V_{IN}$ and common regulator output $V_{OUT}$, each of the regulator phases receiving an input voltage at $V_{IN}$ input 136, and providing an output voltage on $V_{OUT}$ output 148.

A quantity of "N+1" or "N+2" voltage regulator phases can be electrically connected in parallel, where "N" represents a minimum number of phases needed to supply a specified current, and the additional one or two phases can be useful in replacing one or two failed voltage regulator phases. In the case of failure or "faulting" of one or more redundant phases, faulty redundant phase(s) can be disabled in order to share a current load between the remaining active phases, and thus to ensure uninterrupted power delivery. A redundant phase can also be used to implement "masked redundancy," meaning that when a phase fails, the fault is not reported to a system control function 108. The redundant phase can then be used to create a high-reliability regulator instead of being used as a redundant phase. This swapping of regulator phases can be controlled by MPC 122.

Each of the regulator phases 126A, 126B and 126C includes a buck regulator 116, an input protection device 114, an ORing device 118 and a phase-redundant controller 106. The phase-redundant controller 106 can be useful, in conjunction with input protection device 114, in isolating the input of a failed buck regulator 116 from the other phases in the apparatus 100. Phase-redundant controller 106 can monitor input and output current and output voltage of a regulator phase, e.g., 126A, and can control input protection device 114 in response to, for example, abnormal currents or voltages within the phase. Such abnormal currents or voltages can result from the failure, e.g., short-circuiting, of components such as capacitors or FETs within buck regulator 116.

The input protection device 114 can be used for providing input overcurrent protection and output overvoltage protection for a respective regulator phase, e.g., regulator phase 1 126A. Input protection device 114 can protect the regulator phase 1 126A by electrically isolating, i.e., disconnecting, the common regulator input $V_{IN}$ from buck regulator 116, in response to a signal generated by phase-redundant controller 106. Each of the regulator phases 126A, 126B and 126C also includes an ORing device 118 that can be used to limit or prevent reverse current flow into the $V_{OUT}$ output 148 of the regulator phase. Such reverse current flow could possibly result from the short circuiting or failure of a FET or a capacitor within a regulator phase.

An MPC 122 is electrically coupled to each of the regulator phases 126A, 126B and 126C, through detected current outputs 102 and control signals 124. Master controller 112 of the MPC 122 generates control signals 124 to periodically and sequentially activate each of the regulator phases 126A, 126B and 126C for predetermined periods of time. In some applications this activation can be used, for example, to generate controlled current sharing between phases. The MPC 122 can be used to maintain current sharing between active regulator phases following a failure or fault of one or more of the regulator phases with one or more phases provided for enabling redundancy. Current sharing can also be implemented between multiple active regulator phases when none of the phases have previously failed.

Redundant faults reporting circuit 104 of the MPC 122 can collect and report phase faults/failures based on the multiple detected current signals presented on detected current outputs 102A, 102B and 102C from the respective regulator phases. The detected current signals can be used and interpreted in order to indicate the failure of one or more particular regulator phase(s). In some applications, the MPC 122 can provide reduced ripple and transient response time from the redundant regulator phases by staggering the respective $V_{OUT}$ outputs 148 to be out-of-phase with each other. The MPC 122 is also configured to adjust the control signals 124 in response to a feedback output voltage, received at feedback input 101, from the common regulator output $V_{OUT}$.

The serial control bus 120 can be used to interconnect the regulator serial interface 110 of the MPC 122 to a system control function 108. The regulator serial interface 110 can send and receive control and monitoring signals to the system control function 108, which may exert control over one or more phase-redundant regulator apparatuses 100, within an electronic system. In applications, system control function 108 can represent a hardware and/or software unit that can be used in an electronic system such as a computer or server, to monitor and control various aspects of the systems hardware functions. A system control function 108 may be used, within an electronic system to monitor and control functions such as power supply and voltage regulator functions, system clock frequency, cooling, and the like.

In some applications, the serial control bus 120 can be, for example, a Serial Peripheral Interface (SPI) bus, a Power Management Bus (PMBus), or an Inter-Integrated Circuit (I$^2$C) interface. The serial control bus 120 can be used to send monitoring data, for example, indicating which regulator phases have failed or faulted, to the system control function 108, and can also receive commands and controls from the system control function 108.

Figure 2:
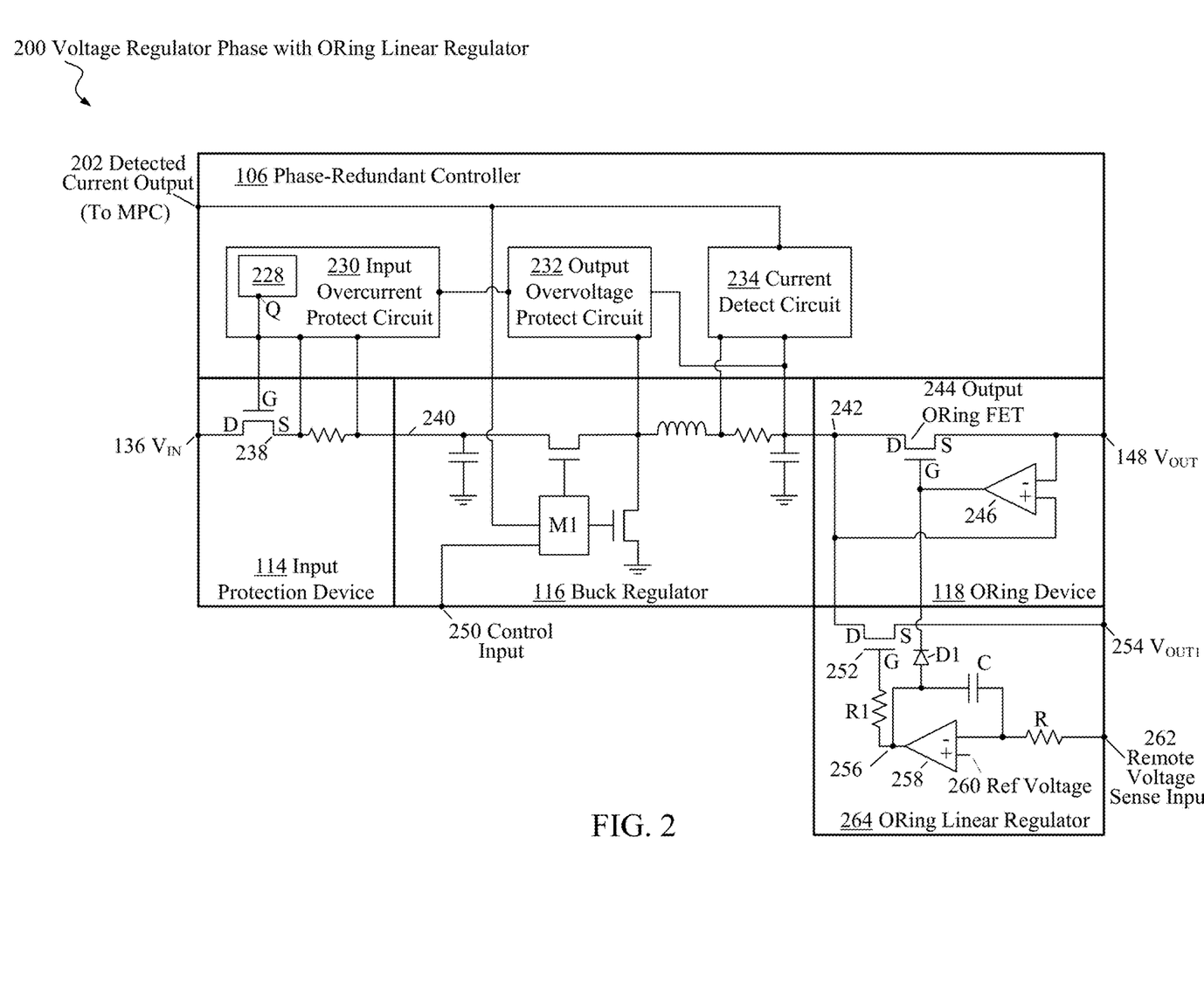
FIG. 2 is a block diagram depicting a phase-redundant voltage regulator apparatus with an ORing linear regulator, according to embodiments consistent with the figures.

FIG. 2 is a block diagram depicting a voltage regulator phase with ORing linear regulator 200, according to embodiments consistent with the figures. The various circuits, functions and functional blocks depicted in FIG. 2 are generally consistent with those depicted in and described with reference to FIG. 1. FIG. 2 can be useful in providing an expanded, more detailed depiction of these functions, as well as depicting the addition of ORing linear regulator 264 to a regulator phase, e.g., 126A, FIG. 1. It can be understood that FIG. 2 generally corresponds to a single regulator phase, e.g., regulator phase 1 126A, FIG. 1, and that the addition of ORing linear regulator 264 can be useful in creating an output voltage that is lower than the output voltage of a phase-redundant regulator phase, e.g., 126A, FIG. 1. It can also be understood that linear ORing device 252, for ease of illustration and discussion, may also be depicted and referred to as "FET 252," herein, without loss of meaning. In embodiments, linear ORing device 252 can be an NFET, a PFET, an NPN transistor, a PNP transistor, or another suitable type of transistor or semiconductor device.

Voltage regulator phase 200 includes buck regulator 116 which can receive an input voltage at regulator input 240 and drive an output voltage onto regulator output 242. Driver M1 is configured to enable and disable FETs within buck regulator 116, in response to a control signal, e.g., 124, FIG. 1, received at control input 250. According to embodiments, control signal 124 can be a digital signal having logical "0" and logical "1" levels of 0 V and 3.3 V, respectively. In some embodiments, other voltage levels may be used.

Voltage regulator phase 200 also includes an input protection device 114, an ORing device 118 and a phase-redundant controller 106. Phase-redundant controller 106 includes current detect circuit 234, output overvoltage protect circuit 232 and input overcurrent protect circuit 230. Input overcurrent protect circuit 230 is electrically connected and configured to monitor current received at the $V_{IN}$ input 136, while output overvoltage protect circuit 232 can monitor output voltage at regulator output 242. Latch 228 is part of input overcurrent protect circuit 230, which is electrically connected to output overvoltage protect circuit 232. Current detect circuit 234 can be used to monitor output current at regulator output 242.

Phase-redundant controller 106 can be useful in monitoring input and output current and output voltage of the voltage regulator phase 200 and can, in response, control input protection device 114, which can be used for providing input overcurrent protection and output overvoltage protection for voltage regulator phase 200.

Phase-redundant controller 106 can control input protection device 114 through asserting the Q output of latch 228 of input overcurrent protect circuit 230. The Q output of latch 228 is used to control a gate input G input of input protection FET 238. Input protection FET 238 has a drain input D coupled to the $V_{IN}$ input 136 a source input S coupled to the regulator input 240. A control signal applied to a gate input G of input protection FET 238 can activate or deactivate input protection FET 238, which either electrically connects or disconnects, respectively, $V_{IN}$ input 136 and regulator input 240 of buck regulator 116. The control of input protection device 114 by phase-redundant controller 106 can be useful in providing input overcurrent protection and output overvoltage protection to the voltage regulator phase 200 by electrically isolating the regulator input 240, when buck regulator 116 faults or fails, from the other phases within a voltage regulator apparatus.

In some applications, current detect circuit 234 can provide, on detected current output 202, a signal having an analog voltage level between 0 V and 3.3 V that proportionally represents a level of detected current flowing out of $V_{OUT}$ output 148 the voltage regulator phase 200. In some applications, other analog voltage levels/ranges may be used. In embodiments, the detected current signal can be useful in indicating the failure of a particular regulator phase.

ORing device 118 can be used to limit or prevent reverse current flow into the $V_{OUT}$ output 148 of the voltage regulator phase 200, and thus also regulate reverse current flow into regulator output 242. Such reverse current flow can result from the short-circuiting or failure of a FET or a capacitor within buck regulator 116. Comparator 246 has inputs electrically connected to a source terminal S and to a drain terminal D of the output ORing FET 244. The output of comparator 246 is electrically connected to gate terminal G of the output ORing FET 244. Comparator 246 configured and connected to, in conjunction with the output ORing FET 244, limit current flow into regulator output 242, in response to a voltage at $V_{OUT}$ output 148 that is greater than a voltage at regulator output 242. In the case where a voltage at $V_{OUT}$ output 148 is greater than a voltage at regulator output 242, indicating a reverse current flow, the comparator 246 outputs to the gate G of output ORing FET 244 a low voltage, thus disabling output ORing FET 244 and preventing further reverse current flow.

The ORing linear regulator 264, electrically connected to a voltage regulator phase, can be used to provide an additional a low-current regulated voltage output to an electronic device or system. ORing linear regulator 264 can provide such a voltage at lower cost, using fewer components and requiring less area within an electronic system than similar solutions using only conventional phase-redundant voltage regulator phases.

The ORing linear regulator 264 includes amplifier 258, which has its positive (+) input electrically connected to a reference voltage input 260, which can receive a reference voltage, for example, 1.1 V. The negative (−) input of the amplifier 258 is electrically connected, through resistor R, to remote voltage sense input 262. The output 256 of amplifier 258 is electrically connected, through a resistor R1, to a control input, e.g., gate G, of the linear ORing device 252. The linear ORing device/FET 252 is electrically coupled to the regulator output 242 at its drain terminal D, and to the $V_{OUT1}$ output 254 at its source terminal S.

In the practice of the present disclosure, remote voltage sense input 262 can be connected to an electrical node on a PCB at a specified location, for example, adjacent to a critical component or group of critical components. Accordingly, the voltage present on remote voltage sense input 262 thus mirrors the voltage received by the critical component(s).

In the above-described configuration, the amplifier 258 is electrically connected to control the linear ORing device 252 to drive a voltage on the $V_{OUT1}$ output 254 so that the voltage at the sense point is equivalent to a voltage on the reference voltage input 260, for example, 1.1 V. If, for example, the remote sense voltage received by the negative input of amplifier 258 is less than the reference voltage received on the reference voltage input 260, the amplifier 258 responds by increasing the output voltage on amplifier output 256. This increased output voltage activates linear ORing device 252 to allow more current to flow to $V_{OUT1}$ output 254, and in turn increase the voltage sensed at the remote sense point and subsequently received at remote voltage sense input 262.

Conversely, if the remote sense voltage received by the negative input of amplifier 258 is greater than the reference voltage received on the reference voltage input 260, the output voltage at $V_{OUT1}$ output 254 is thus reduced by the amplifier 258, FIG. 2. This process of adjustment of the output current and voltage at $V_{OUT1}$ output 254 is a continuous, ongoing process, and results in the sense point voltage received at reference voltage input 260 mirroring the reference voltage. This adjustment process continues until the sense voltage received on the negative pin of the amplifier 258 is equivalent to the voltage on the positive of the amplifier 258, e.g., 1.1 V.

The above-described adjustment process is useful for creating a stable, regulated low-current "secondary" or "supplemental" voltage source for powering certain devices within an electronic system. The adjustment process can be particularly useful in responding to dynamically fluctuating current loads which may cause the voltage received at the sense point to vary, as a result of voltage drop in wiring between the $V_{OUT1}$ output 254 and the sense point. Such dynamic voltage fluctuations can activate the above-described adjustment process, which can automatically compensate for the changing current draw, and thus maintain a stable, precise voltage delivery at the sense point. In some embodiments, an example difference between the voltage at a sense point and a reference voltage can be less than 20 mV, which can include both AC and DC excursions. In some embodiments, other voltage differences between the voltage at a sense point and a reference voltage can be achieved. In certain embodiments, amplifier 258 can be an operational amplifier (op-amp).

According to embodiments, a control input/gate G of the output ORing FET 244 is electrically connected, through diode D1, to the control input G of the linear ORing device 252. This connection provided by diode D1 can be used to turn off the ORing linear regulator 264, in response to the detection of a fault in buck regulator 116. For example, the comparator 246 can detect a reverse current flow into the $V_{OUT}$ output 148, possibly due to a fault in buck regulator 116, and drive gate G of the output ORing FET 244 to a low voltage, which turns off output ORing FET 244. This low voltage level is accordingly transferred through diode D1 to the gate G of linear ORing device 252, which is similarly turned off. Thus, both of the output ORing FET 244 and the linear ORing device 252 are simultaneously turned off in response to a buck regulator 116 fault, thus electrically disconnecting the buck regulator 116 from both $V_{OUT}$ output 148 and $V_{OUT1}$ output 254. Faults in buck regulator 116 can include, for example, short-circuits of a FET or of a capacitor.

Other regulator fault indications such as overvoltage, undervoltage and overcurrent, can also be detected, and accordingly, result in the output of comparator 246 being driven low, with the same net effect of simultaneously electrically disconnecting the $V_{OUT}$ output 148 and $V_{OUT1}$ output 254 from the buck regulator 116.

In some embodiments, the voltage driven on the $V_{OUT1}$ output of the ORing linear regulator 264 can be in a range between 0.1 V and 1.0 V lower than a voltage driven on the regulator output, e.g., $V_{OUT}$ output 148 of a respective regulator. For example, the voltage on $V_{OUT}$ output 148 can be 2.0 V, and the voltage on the $V_{OUT1}$ output of the ORing linear regulator 264 can be in a range between 1.0 V and 1.9 V. In some embodiments, a current provided by the $V_{OUT1}$ output 254 of the ORing linear regulator 264 can be in a range between 0.1 A and 5.0 A. In the practice of the present disclosure, a designer can select components such as resistors R and R1, capacitor C, amplifier or op-amp 258, and linear ORing device 252 in order to create a responsive, precise control/feedback loop, as described above.

Figure 3:
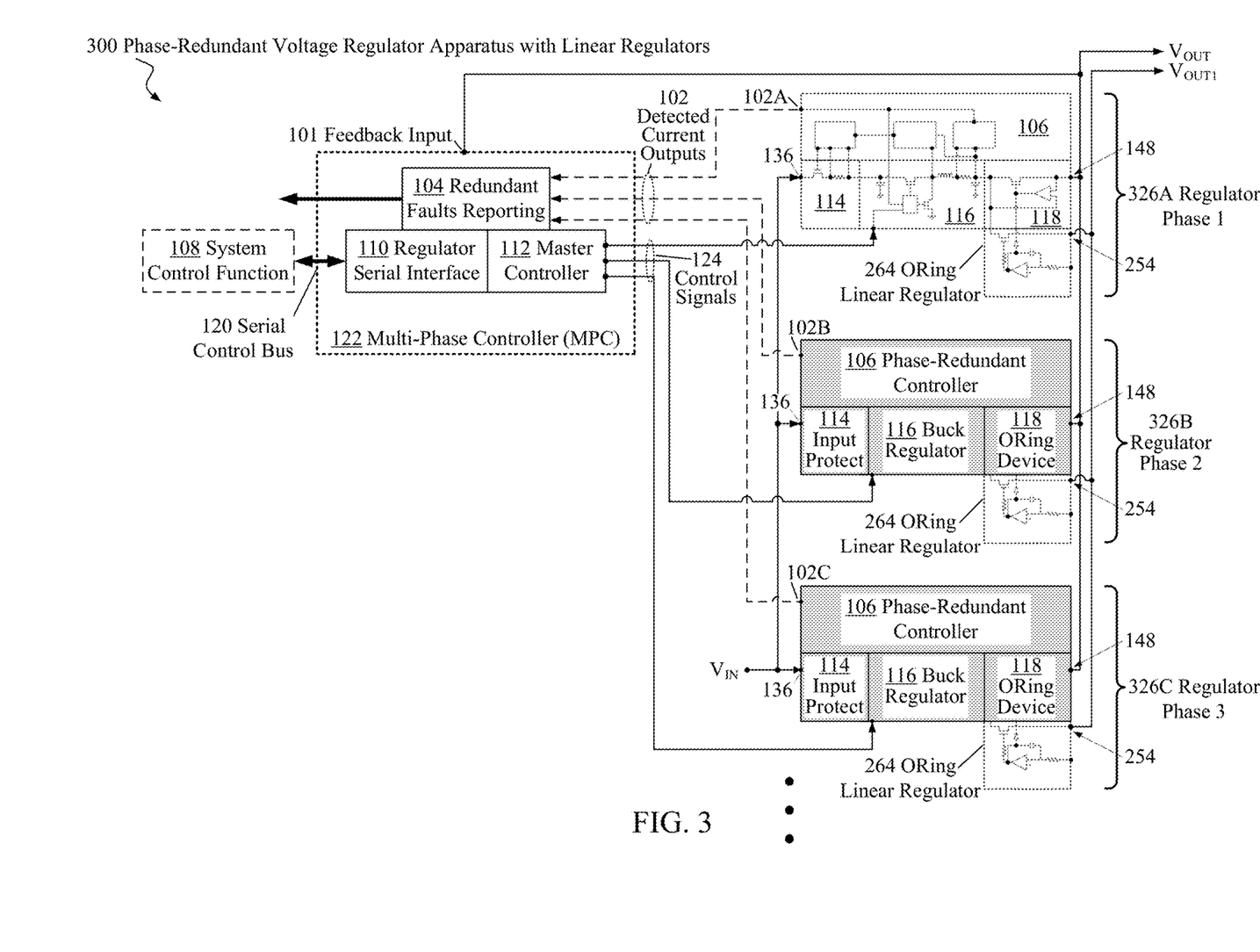
FIG. 3 is a block diagram depicting a phase-redundant voltage regulator apparatus with linear regulators, according to embodiments consistent with the figures.

FIG. 3 is a block diagram depicting a phase-redundant voltage regulator apparatus with linear regulators 300, according to embodiments generally consistent with the figures. FIG. 3 is particularly useful in depicting a phase-redundant voltage regulator apparatus, consistent with FIG. 1 and FIG. 2 that includes added ORing linear regulators 264. Numerous aspects of the embodiments depicted in FIG. 3 are particularly consistent with those depicted in FIGS. 1 and 2, and described in the associated text, and will not be further described herein. These aspects include circuits, logical and control functions, interactions between functions, electrical interconnections, signal usage and signal voltage ranges.

In embodiments, $V_{IN}$ inputs 136 of a plurality of regulator phases 326A, 326B and 326C are each electrically connected to a common regulator input $V_{IN}$. Each of the regulator phases 326A, 326B and 326C includes an ORing linear regulator 264. According to embodiments, the $V_{OUT1}$ outputs 254 of the ORing linear regulators 264 are each electrically connected to common regulator output $V_{OUT1}$. Similarly, the $V_{OUT}$ outputs 148 of the ORing devices 118 are each electrically connected to common regulator output $V_{OUT}$.

Embodiments of the present disclosure can be useful in reducing voltage regulator packaging size and cost, relative to a voltage regulator that uses complete phase-redundant voltage regulator levels to provide low-current voltage levels. These efficiencies are gained through the use of ORing circuit electrical components and an amplifier, e.g., 258, FIG. 2, in place of the various control and monitoring circuits, phase-redundant controller 106, input protection device 114 and buck regulator 116 of a phase-redundant voltage regulator, as depicted in FIG. 1 and FIG. 2.

In some embodiments, the additional ORing linear regulators 264 can take advantage of the redundancy of the phases that they are electrically connected to, in order to provide a phase-redundant low-current voltage supply. For example, if three redundant voltage regulator phases are used to produce a 1.2 V output, and an ORing linear regulator 264 is electrically connected to each one of the phases, then the linear ORing regulators can provide the same redundancy as their "parent" regulators.

According to embodiments, a quantity of "N+1" or "N+2" voltage regulator phases can be electrically connected in parallel, where "N" is a minimum number of phases needed to supply a specified current, and the additional one or two phases can be useful in replacing one or two failed regulator phases. In the case of failure or "faulting" of one or more redundant phases, faulty redundant phase(s) can be disabled in order to share a current load and to ensure uninterrupted power delivery.

FIG. 3 depicts a phase-redundant voltage regulator having no current sharing circuitry between the regulator phases 326A, 326B and 326C. Embodiments are contemplated, however, where current sharing is maintained between the ORing linear regulators 264, FIG. 2. In some such embodiments, independent current throttle points could be implemented within each regulator phase 326A, 326B and 326C and in each ORing linear regulator 264, to enable a phase to run at its current output limit while one or more other ORing linear regulator(s) 264 provide the additional current required to satisfy a total current load. This embodiment can enable simplified current-sharing, which can allow certain ORing linear regulator(s) 264 to run at full current load, while additional ORing linear regulator(s) 264 can run at lower current levels. In some embodiments, passive or "droop" sharing can be implemented, where current sharing can result from a phase-redundant regulator output voltage drooping below a specified reference voltage, and, in response, the various regulator phases electrically connected to that output boost their respective current outputs. This can result in the sharing of the load between the regulators. In some embodiments, active or "forced" current sharing can be implemented through the use of added current monitoring, control, and feedback loops.

Figure 4:
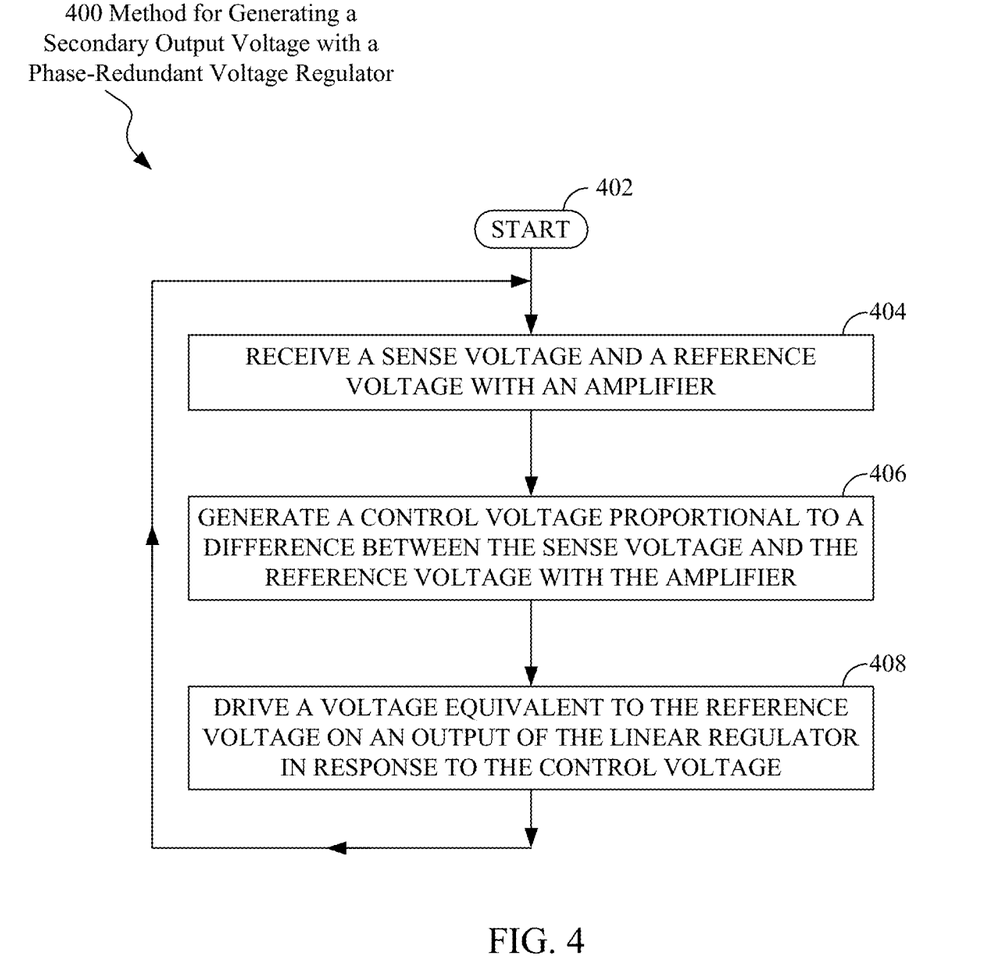
FIG. 4 is a flow diagram depicting a method for generating a secondary output voltage with a phase-redundant voltage regulator, according to embodiments consistent with the figures.

FIG. 4 is a flow diagram depicting a method 400 for generating a secondary output voltage with a phase-redundant voltage regulator apparatus, according to embodiments consistent with the figures. The phase-redundant voltage regulator apparatus includes a plurality of ORing linear regulators 264, FIG. 3, and is consistent with the phase-redundant voltage regulators and apparatus depicted in and described in reference to FIGS. 1-3.

The execution of method 400 can provide, through the use of an ORing linear regulator 264 included within a phase-redundant voltage regulator apparatus, precise, dynamically adjusted, power delivery at a voltage within a specified tolerance of a provided reference voltage. When used in conjunction with a phase-redundant voltage regulator apparatus of an electronic system, method 400 can also provide for substantial decreases in voltage regulator cost, packing area, complexity, and failure rate, through the use of ORing linear regulator(s). Such improvements can result in corresponding overall decreases in electronic system cost, complexity, and failure rate. The method depicted and described with reference to FIG. 4 is generally consistent with the phase-redundant voltage regulator and apparatus depicted in and described in reference to FIGS. 1-3.

The method 400 moves from start 402 to operation 404. Operation 404 generally refers to receiving, with an amplifier within a ORing linear regulator (264, FIG. 2), a remote sense voltage at a remote voltage sense input and a reference voltage at the reference voltage input. In embodiments, the sense voltage can be sensed at a node on a PCB at a specified location, for example, adjacent to a critical component or group of components. Accordingly, the remote sense voltage mirrors a supply voltage received by the critical component or group of components. A reference voltage can be provided to the amplifier 258, FIG. 2, from a reference voltage circuit such as a voltage divider, or zener diode reference circuit. In embodiments, the reference voltage is received at the positive input of the amplifier 258, FIG. 2, and remote sense voltage is received at the negative input of the amplifier. Once remote sense voltage and the reference voltage have been received, the method 400 moves to operation 406.

Operation 406 generally refers to generating, at the output amplifier output 256, FIG. 2, of the amplifier, a control voltage corresponding to a difference between a sense voltage and the reference voltage. According to embodiments, the amplifier 258, FIG. 2, generates an output voltage at amplifier output 256, FIG. 2, that is proportional to the difference between the reference voltage and the sense voltage, i.e., the reference voltage minus the sense voltage. This output voltage can vary over time, as the sense voltage changes, possibly in response to dynamic current draw from devices powered by the output of the ORing linear regulator 264, FIG. 2. The magnitude of the output voltage and response characteristics of the amplifier can be varied through the selection of external components such as resistors and capacitors that are electrically connected to the amplifier. Once the control voltage has been generated, the method 400 moves to operation 408.

Operation 408 generally refers to driving, with the linear ORing device 252, FIG. 2, a voltage on the output, e.g., $V_{OUT1}$ output 254, FIG. 2, of the ORing linear regulator 264, FIG. 2, that is equivalent to the reference voltage. The output voltage is driven in response to the control voltage received at the input of the linear ORing device. In embodiments, the linear ORing device 252, FIG. 2, can be an NFET, a PFET, an NPN transistor, a PNP transistor, or another suitable type of transistor or semiconductor device. In some embodiments, the voltage on the output of the linear ORing regulator is driven to a value that is within a specified tolerance of the sense voltage. For example, in some embodiments, the specified tolerance can be +/−20 mV, which can include both AC and DC excursions. Once the voltage has been driven on the output of the ORing linear regulator, the method 400 returns to operation 404.

The return of method 400 to operation 404 from operation 408 is indicative that the operations depicted and described in FIG. 4 are part of a closed electrical feedback loop, where the output voltage of the linear regulator is continuously adjusted to match the voltage at a remote sense point to the reference voltage received by amplifier. This continuous electrical feedback loop can be particularly useful in maintaining, with a high degree of precision, the voltage received by the critical component(s) near the remote sense point. During operation of a host electronic system, a current load of the linear regulator may vary, based upon the operation of components connected to the linear regulator. The control voltage generated in operation 406 is responsive to dynamic sense voltages resulting from this changing current load, and can thus result in robust voltage regulator operation under a wide range of operating and dynamic current load conditions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A phase-redundant voltage regulator apparatus comprising:
a plurality of regulator phases connected in parallel between a common regulator input and a common regulator output, at least one regulator phase of the plurality of regulator phases enabling redundancy, each regulator phase of the plurality of regulator phases including a regulator configured to receive, at a regulator input, an input voltage and provide, at a regulator output, a respective output voltage; and
a plurality of linear regulators, each linear regulator of the plurality of linear regulators having:
a linear ORing device electrically connected between the regulator output of a respective regulator and an output of the linear regulator;
an amplifier having inputs electrically connected to a remote voltage sense input and to a reference voltage input, the amplifier further having an output electrically connected to an input of the linear ORing device, the amplifier configured to control the linear ORing device to drive a voltage on the output of the linear regulator equivalent to a voltage on the reference voltage input.

2. The phase-redundant voltage regulator apparatus of claim 1, each regulator phase of the plurality of regulator phases further including:
a phase-redundant controller configured to monitor current at the regulator input and further configured to monitor current and voltage at the regulator output;
an output ORing device configured to limit current flow into the output of the respective regulator phase; and
an input protection device configured to provide, in response to a control signal from the phase-redundant controller, input overcurrent protection and output overvoltage protection to the respective regulator phase.

3. The phase-redundant voltage regulator apparatus of claim 2, further comprising:
a multi-phase controller (MPC) coupled to each regulator phase of the plurality of regulator phases, the MPC configured to:
receive a feedback output voltage and a respective detected current signal from each regulator phase of the plurality of regulator phases;
generate control signals to sequentially activate each regulator phase of the plurality of regulator phases for predetermined periods of time, the control signals managing controlled current-sharing between phases; and
maintain, following a failure of one or more regulator phase of the plurality of regulator phases, current-sharing between all active regulator phases of the plurality of regulator phases.

4. The phase-redundant voltage regulator apparatus of claim 1, wherein the voltage driven on the output of the linear regulator is in a range between 0.1 V and 1.0 V lower than a voltage driven on the regulator output of a respective regulator.

5. The phase-redundant voltage regulator apparatus of claim 1, wherein a current provided by the output of the linear regulator is in a range between 0.1 A and 5.0 A.

6. The phase-redundant voltage regulator apparatus of claim 1, wherein the linear ORing device is selected from the group consisting of: an N-channel field-effect transistor (NFET), a P-channel field-effect transistor (PFET), an NPN transistor, and a PNP transistor.

7. The phase-redundant voltage regulator apparatus of claim 1, wherein the amplifier is an operational amplifier (op-amp).

8. The phase-redundant voltage regulator apparatus of claim 1, wherein outputs of the linear regulators of the plurality of linear regulators are electrically connected to a common linear regulator output.

9. The phase-redundant voltage regulator apparatus of claim 1, wherein the plurality of linear regulators are configured to maintain current sharing.

10. A phase-redundant voltage regulator apparatus comprising:
a plurality of regulator phases connected in parallel between a common regulator input and a common regulator output, at least one regulator phase of the plurality of regulator phases enabling redundancy, each regulator phase of the plurality of regulator phases including a regulator configured to receive, at a regulator input, an input voltage and provide, at a regulator output, a respective output voltage; and
a plurality of linear regulators, each linear regulator of the plurality of linear regulators having:
a linear ORing field-effect transistor (FET) electrically connected between the regulator output of a respective regulator phase and an output of the linear regulator;
an operational amplifier (op-amp) having a negative input electrically coupled to a remote voltage sense input and a positive input electrically coupled to a reference voltage input, the op-amp further having an output electrically connected to a gate terminal of the linear ORing FET, the op-amp configured to control the linear ORing FET to drive a voltage on the output of the linear regulator equivalent to a voltage on the reference voltage input.

11. The phase-redundant voltage regulator apparatus of claim 10, each regulator phase of the plurality of regulator phases further including:
an output ORing FET electrically coupled between the regulator output and the common regulator output;
a comparator having inputs electrically connected to a source terminal and to a drain terminal of the output ORing FET, the comparator further having an output electrically connected to a gate terminal of the output ORing FET, the comparator configured to, in conjunction with the output ORing FET, limit current flow into the regulator output;
an input protection FET coupled between the common regulator input and the regulator input; and
a latch having an output electrically connected to a gate terminal of the input protection FET, the latch configured to, in conjunction with the input protection FET, provide input overcurrent protection and output overvoltage protection to the regulator phase.

12. The phase-redundant voltage regulator apparatus of claim 11, further comprising:
a multi-phase controller (MPC) coupled to each regulator phase of the plurality of regulator phases, the MPC configured to:
receive a feedback output voltage and a respective detected current signal from each regulator phase of the plurality of regulator phases;
generate control signals to sequentially activate each regulator phase of the plurality of regulator phases for predetermined periods of time, the control signals managing controlled current-sharing between phases; and
maintain, following a failure of one or more regulator phase of the plurality of regulator phases, current-sharing between all active regulator phases of the plurality of regulator phases.

13. The phase-redundant voltage regulator apparatus of claim 10, wherein a regulator serial interface of a multi-phase controller (MPC) is coupled to a system control function through a serial control bus selected from the group consisting of: an Serial Peripheral Interface (SPI) interface, a Power Management Bus (PMBus) interface, and an Inter-Integrated Circuit ($I^2C$) interface.

14. The phase-redundant voltage regulator apparatus of claim 10, wherein the plurality of regulator phases includes two redundant phases in addition to a minimum number of phases required to supply a specified current to a host system.

15. The phase-redundant voltage regulator apparatus of claim 11, wherein a control input of the output ORing FET is electrically connected, through a diode, to the control input of the linear ORing device.

16. The phase-redundant voltage regulator apparatus of claim 10, wherein outputs of the linear regulators of the plurality of linear regulators are electrically connected to a common linear regulator output.

17. The phase-redundant voltage regulator apparatus of claim 10, wherein the plurality of linear regulators are configured to maintain current sharing.

18. A method for generating, with a phase-redundant voltage regulator apparatus that includes a plurality of linear regulators, a secondary output voltage, the phase-redundant voltage regulator apparatus including:
a plurality of regulator phases connected in parallel between a common regulator input and a common regulator output, at least one regulator phase of the plurality of regulator phases enabling redundancy, each regulator phase of the plurality of regulator phases including a regulator configured to receive, at a regulator input, an input voltage and provide, at a regulator output, a respective output voltage; and
a plurality of linear regulators, each linear regulator of the plurality of linear regulators having:
a linear ORing device electrically connected between the regulator output of a respective regulator and an output of the linear regulator;
an amplifier having inputs electrically connected to a remote voltage sense input and to a reference voltage input, the amplifier further having an output electrically connected to an input of the linear ORing device, the amplifier configured to control the linear ORing device to drive a voltage on the output of the linear regulator equivalent to a voltage on the reference voltage input;
the method comprising:
receiving, with the amplifier, a sense voltage at the remote voltage sense input and a reference voltage at the reference voltage input;
generating, at the output of the amplifier, a control voltage corresponding to a difference between a sense voltage and the reference voltage; and
driving, with the linear ORing device, in response to the control voltage received at the input of the linear ORing device, a voltage on the output of the linear regulator that is equivalent to the reference voltage.

19. The method of claim 18, wherein the sense voltage that is received with the amplifier originates at a location on a printed circuit board (PCB) that is adjacent to a component mounted on the PCB.

20. The method of claim 18, wherein the voltage on the output of the linear regulator is driven to a value within a specified tolerance of the sense voltage.

\* \* \* \* \*